United States Patent
Yamauchi et al.

(10) Patent No.: US 8,270,179 B2
(45) Date of Patent: Sep. 18, 2012

(54) PRINTED CIRCUIT BOARD AND METHOD FOR MOUNTING ELECTRONIC COMPONENTS

(75) Inventors: Hideaki Yamauchi, Osaka (JP); Haruya Sakuma, Fukushima (JP); Masataka Saitoh, Yamagata (JP)

(73) Assignee: Panasonic Corporation, Osaka (JP)

( * ) Notice: Subject to any disclaimer, the term of this patent is extended or adjusted under 35 U.S.C. 154(b) by 250 days.

(21) Appl. No.: 12/644,155

(22) Filed: Dec. 22, 2009

(65) Prior Publication Data
US 2010/0157559 A1    Jun. 24, 2010

(30) Foreign Application Priority Data
Dec. 24, 2008  (JP) ................................. 2008-326926

(51) Int. Cl.
*H05K 7/00* (2006.01)

(52) U.S. Cl. ......... 361/783; 361/748; 361/760; 361/792

(58) Field of Classification Search .................. 361/783, 361/792, 748, 760
See application file for complete search history.

(56) References Cited

U.S. PATENT DOCUMENTS
6,307,751 B1 *  10/2001  Bodony et al. ................ 361/749

FOREIGN PATENT DOCUMENTS
| JP | 5-152710 | | 6/1993 |
| JP | 05152710 A | * | 6/1993 |
| JP | 5-259694 | | 10/1993 |
| JP | 6-105081 | | 4/1994 |
| JP | 9-223856 | | 8/1997 |

* cited by examiner

*Primary Examiner* — Yuriy Semenenko
*Assistant Examiner* — Andargie M Aychillhum
(74) *Attorney, Agent, or Firm* — Panasonic Patent Center; Dhiren Odedra; Kerry Culpepper

(57) ABSTRACT

In a case where the first component and the third component are mountable on the first circuit board pattern of the first individual board and the second component is mountable on the second circuit board pattern of the first individual board, or in a case where the first component is mountable on the first circuit board pattern of the second individual board, and the second component and the third component are mountable on the second circuit board pattern of the second individual board, in the first and second individual boards, traces for the third component are provided so that electrical connections between the third component and the other components are identical between the case where the third component is mounted on the first circuit board pattern, and the case where the third component is mounted on the second circuit board pattern.

12 Claims, 5 Drawing Sheets

(FIRST CIRCUIT BOARD PATTERN)

(SECOND CIRCUIT BOARD PATTERN)

(BEFORE MOUNTING)

(AFTER MOUNTING)

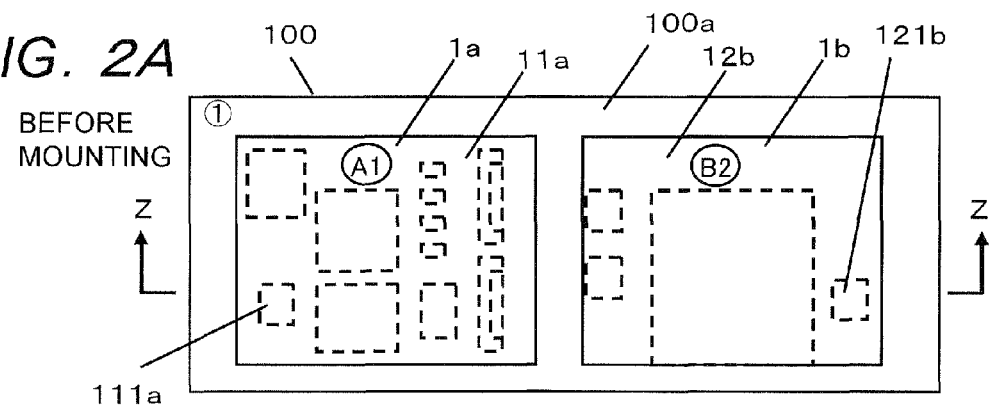
FIG. 2A BEFORE MOUNTING
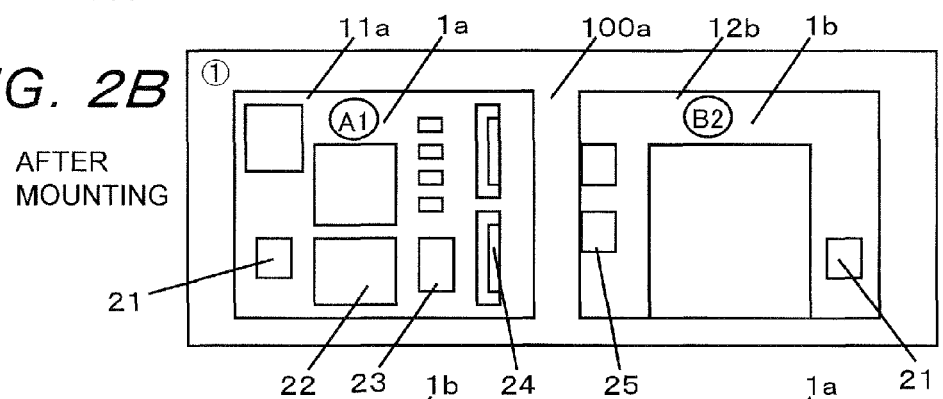
FIG. 2B AFTER MOUNTING
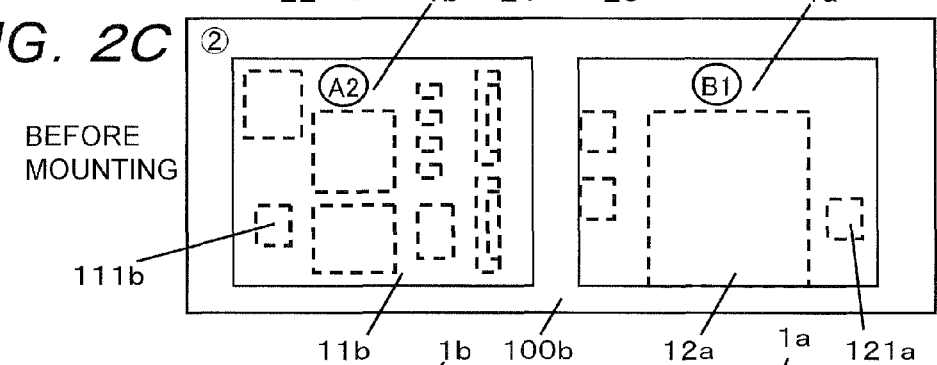
FIG. 2C BEFORE MOUNTING
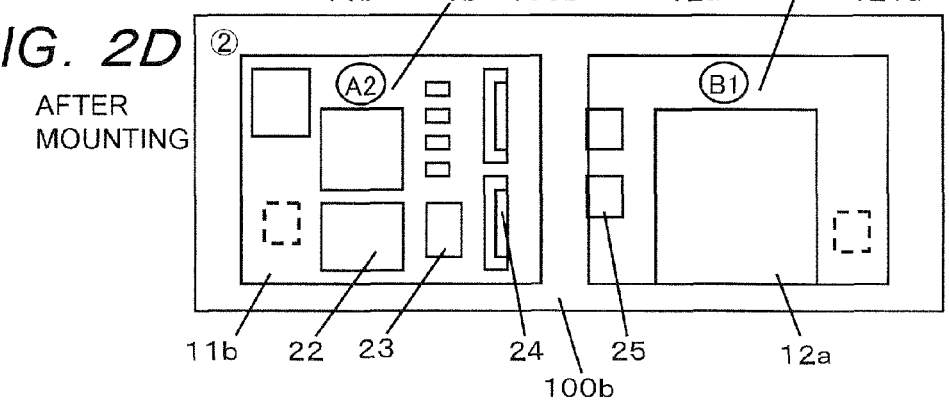
FIG. 2D AFTER MOUNTING

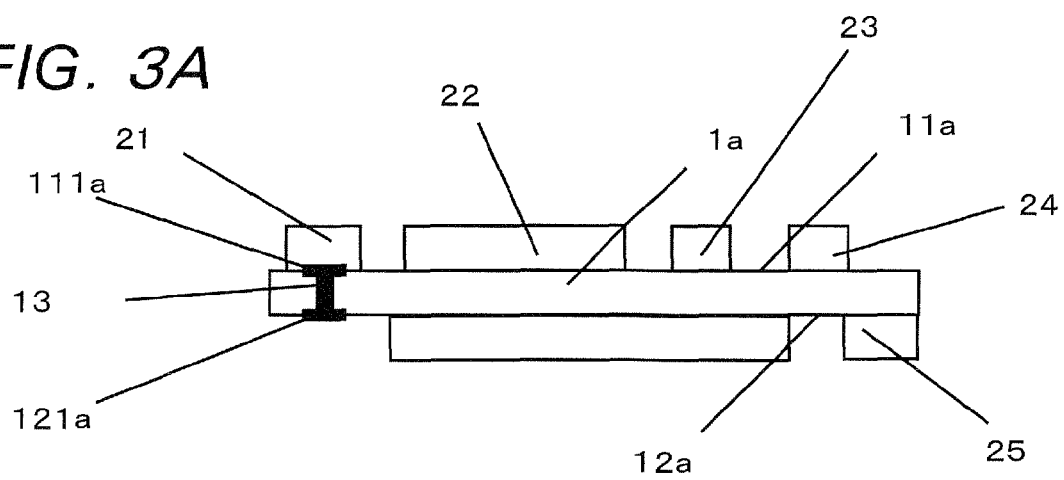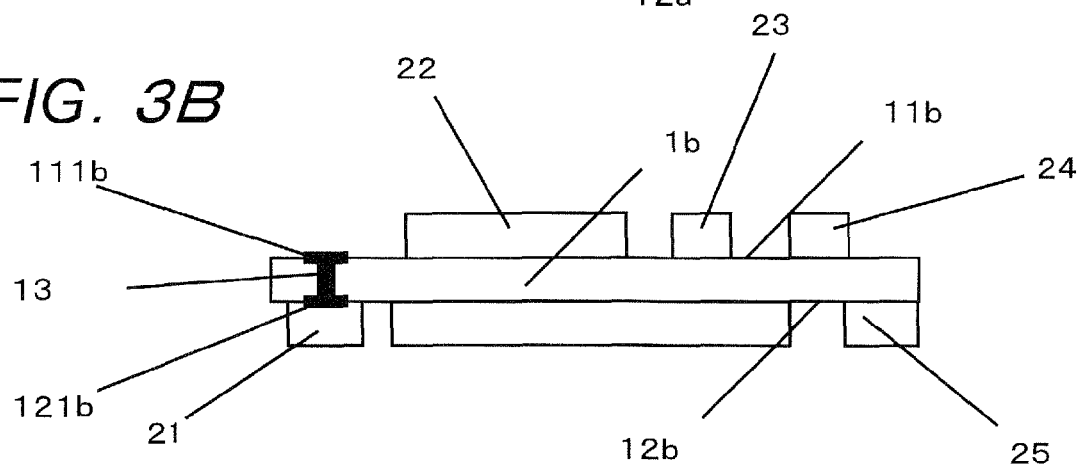

PRINTED CIRCUIT BOARD AND METHOD FOR MOUNTING ELECTRONIC COMPONENTS

BACKGROUND

1. Technical Field

The technical field relates to a printed circuit board on which electronic components can be mounted on both sides. Moreover, the technical field relates to a method for mounting electronic components on a both-side mounting printed circuit board.

2. Related Art

Conventionally, there has been a method for mounting electronic components using a both-side mounting printed circuit board that includes a primary mounting surface in the one surface and a secondary mounting surface on the other surface, to which a plurality of identical individual boards are allocated. In such a printed circuit board, for example, after the electronic components are mounted on the primary mounting surface, the printed circuit board is turned over to mount electronic components on the secondary mounting surface.

As a method for increasing efficiency in mounting the electronic components on the both-side mounting printed circuit board, for example, a method described in JPA-9-223856 is cited. In the mounting method described in JPA-9-223856, a plurality of individual boards are adjacently arranged on the printed circuit board, and at this time, a front surface of one individual board and a back surface of another individual board are arranged on one mounting surface of the printed circuit board, and a back surface of the one individual board and a front surface of the other individual board are arranged on the other mounting surface of the printed circuit board. That is, the front surface and the back surface of the individual boards are arrayed so as to be located alternately. Electronic components are mounted on the one mounting surface of the above-described printed circuit board, and then, the printed circuit board is turned over with a border line between the one individual board and the other individual board used as an axis for turning over to mount electronic components on the other mounting surface of the printed circuit board. Thereby, mounting positions of the electronic components are identical when the printed circuit board is turned over, which allows the same mounting jig to be used on the primary mounting surface side and a secondary mounting surface side, and increases efficiency in the electronic component mounting.

When electronic components are mounted on a printed circuit board, generally, reflow soldering is performed. The reflow soldering raises a temperature of the printed circuit board. At this time, generated heat causes warpage in the printed circuit board. This warpage changes mounting positions of the electronic components (i.e., spacing of portions where each of the electronic components is soldered) on the printed circuit board. As a result, the spacing between electronic component soldering portions and the spacing between terminals of the electronic component are misaligned, which may lead to a soldering failure. In recent years, down-sizing of the electronic components has been developed, and miniaturization of a pitch between the terminals has been advanced. The electronic component with a narrow pitch between the terminals is especially susceptible to the warpage, and thus, the above-described problem is easily caused.

In order to solve the above-described problem, an object is to provide a printed circuit board capable of increasing mounting efficiency while reducing mounting failures of electronic components.

Moreover, in order to solve the above-described problem, another object is to provide a method for mounting electronic components capable of increasing mounting efficiency while reducing mounting failures of the electronic components on the printed circuit board.

SUMMARY

A first aspect provides a printed circuit board. The printed circuit board comprises: a primary mounting surface and a secondary mounting surface, to which at least first and second individual boards are provided, a first circuit board pattern, on which a first component and a third component are mountable, provided on the primary mounting surface side of the first individual board, and a second circuit board pattern, on which a second component and the third component are mountable, provided on the secondary mounting surface side of the first individual board, the first circuit board pattern, on which the first component and the third component are mountable, provided on the secondary mounting surface side of the second individual board, and the second circuit board pattern, on which the second component and the third component are mountable, provided on the primary mounting surface side of the second individual board, wherein: in a case where the first component and the third component are mountable on the first circuit board pattern of the first individual board and the second component is mountable on the second circuit board pattern of the first individual board, or in a case where the first component is mountable on the first circuit board pattern of the second individual board, and the second component and the third component are mountable on the second circuit board pattern of the second individual board, in the first and second individual boards, traces for the third component are provided so that electrical connections between the third component and the other components are identical between the case where the third component is mounted on the first circuit board pattern, and the case where the third component is mounted on the second circuit board pattern.

A second aspect provides a method for mounting electronic components on a printed circuit board having a primary mounting surface and a secondary mounting surface, to which at least first and second individual boards are provided. The method comprises: providing the printed circuit board, the printed circuit board including: a first circuit board pattern, on which a first component and a third component are mountable, provided on the primary mounting surface side of the first individual board, and a second circuit board pattern, on which a second component and the third component are mountable, provided on the secondary mounting surface side of the first individual board, the first circuit board pattern, on which the first component and the third component are mountable, provided on the secondary mounting surface side of the second individual board, and the second circuit board pattern, on which the second component and the third component are mountable, provided on the primary mounting surface side of the second individual board, and in the first and second individual boards, traces for the third component are provided so that electrical connections between the third component and the other components are identical between a case where the third component is mounted on the first circuit board pattern, and a case where the third component is mounted on the second circuit board pattern, mounting the first component and the third component on the first circuit board pattern of the first individual board, and mounting the second component and the third component on the second circuit board pattern of the second individual board, and mounting the second component on the second circuit board pattern of the first individual board, and mounting the first component on the first circuit board pattern of the second individual board.

With the above-described configuration, in the first and second individual boards, the electrical connections can be identical between the case where the third component is mounted on the first circuit board pattern, and the case where the third component is mounted on the second circuit board pattern. This can increase mounting efficiency while reducing mounting failures of the electronic components on the printed circuit board.

This can increase mounting efficiency while reducing mounting failures of the electronic components on the printed circuit board.

According to the present aspects, the mounting efficiency can be increased while reducing mounting failures of the electronic components on the printed circuit board.

BRIEF DESCRIPTION OF DRAWINGS

FIGS. 2A to 2D show a method for mounting electronic components according to the embodiment.

FIGS. 3A and 3B are views for explaining the method for mounting the electronic components according to the embodiment.

DETAIL DESCRIPTION OF PREFERRED EMBODIMENT

Embodiment 1

Hereinafter, referring to FIGS. 1 to 5, a printed circuit board and a method for mounting electronic components on this printed circuit board according to the present embodiment are described. In Embodiment 1, an example in which the printed circuit board of the first aspect is applied to a sheet 100 (printed circuit board, refer to FIG. 3) is described. Moreover, an example in which the method for mounting the electronic components of the second aspect is applied to a method for mounting the electronic components is described.

1. Overview

Figure 1A:
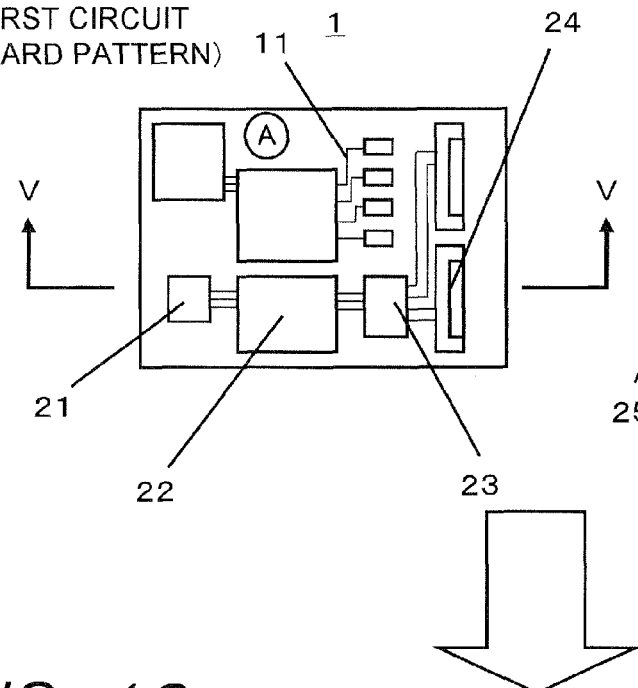
FIGS. 1A to 1D show an individual board according to an embodiment.
Figure 1B:
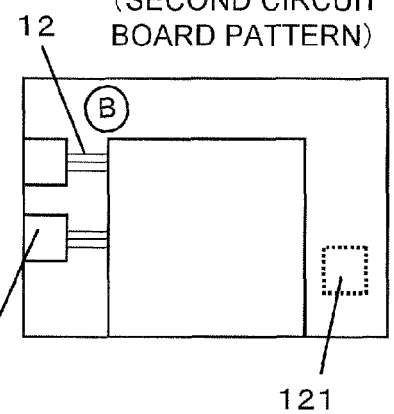
Figure 1C:
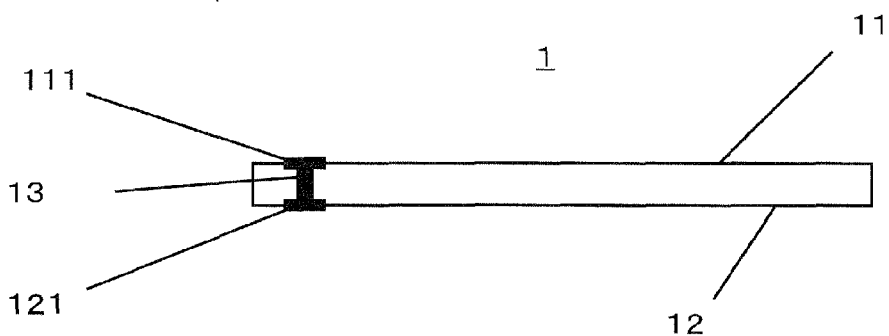
Figure 1D:
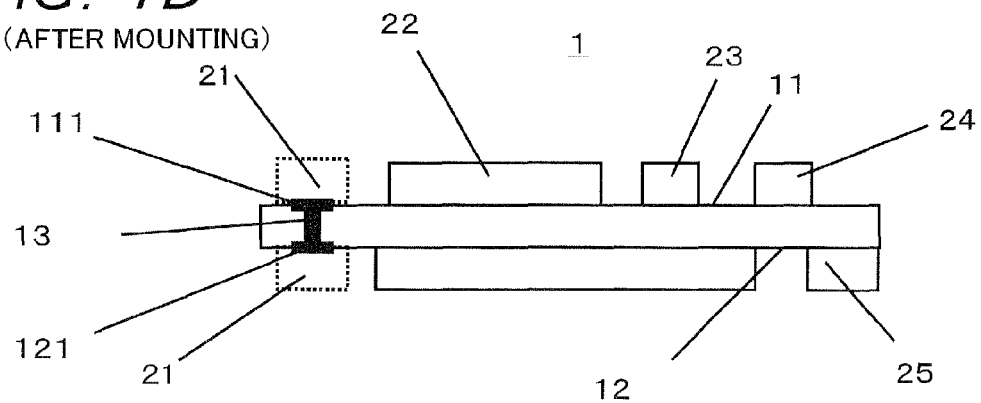

FIGS. 1A and 1B are views showing a structure of an individual board 1 which is finally manufactured from the printed circuit board of the present embodiment. In the individual board 1, a first circuit board pattern (first pattern) 11 is formed on the one surface and a second circuit board pattern (second pattern) 12 is formed on another surface. Here, first and second circuit patterns 11 and 12 are traces or conductors for electrical circuit made of conductive material on both surfaces of individual board 1 (the traces are omitted on other figures), respectively. FIG. 1A is a view showing the first pattern 11 of the individual board 1, and FIG. 1B is a view showing the second pattern 12 of the individual board 1. FIG. 1C is a V-V cross-sectional view of the individual board 1 shown in FIG. 1A before mounting the electronic components, and FIG. 1D is a cross-sectional view of the individual board 1 after mounting the electronic components. Here, as shown in FIG. 1C, the individual board 1 is provided with a first land 111 of the first pattern 11, and a second land 121 of the second pattern 12. An electronic component (hereinafter, referred to as a "specific electronic component") 21 can be mounted on either of the first land 111 and the second land 121 as shown in FIG. 1D. The first land 111 and the second land 121 are connected with a through-hole 13.

The specific electronic component 21 is a chip-carrier type electronic component of having small terminal spacing (e.g., 0.5 mm or less), for example, an SOJ or a BGA, which is susceptible to warpage of the printed circuit board at the time of mounting. Moreover, the specific electronic component 21 may be a WCSP (Wafer Level Chip Size Package).

Moreover, as shown in FIGS. 1A and 1D, in addition to the specific electronic component 21, electronic components 22 and 23, a connector 24 and the like are mounted on the first pattern 11, and an electronic component 25 and the like are mounted on the second pattern 12.

FIG. 2 is a view for explaining the method for mounting the electronic components on the printed circuit board. In the present embodiment, as shown in FIG. 2A, two individual boards are allocated on the sheet 100 (printed circuit board), and two individual boards 1a and 1b are to be finally formed from the one sheet 100. Here, the sheet 100 has a primary mounting surface 100a on which electronic components are first mounted, and a secondary mounting surface 100b on which electronic components are mounted after the electric components are mounted on the primary mounting surface 100a. On the primary mounting surface 100a side of the sheet 100, as shown in FIG. 2A, a first pattern 11a of the individual board 1a and a second pattern 12b of the individual board 1b are formed. Moreover, on the secondary mounting surface 100b side of the sheet 100, as shown in FIG. 2O, a second pattern 12a of the individual board 1a, and a first pattern 11b of the individual board 1b are formed. That is, the individual board 1a and the individual board 1b allocated on the sheet 100 are formed so that the front side and the back side thereof are reversed. On the first pattern 11a of the individual board 1a and the first pattern 11b of the individual board 1b, the same components 22, 23, 24, . . . excluding the specific electronic component 21 are surely arranged. Moreover, on the second pattern 12a of the individual board 1a and the second pattern 12b of the individual board 1b, the same components 25, . . . excluding the specific electronic component 21 are surely arranged. The specific electronic components 21 are mounted on the different circuit board pattern between the individual board 1a and the individual board 1b. For example, when the specific electronic component 21 is mounted on the first pattern 11a of the individual board 1a, the specific electronic component 21 is mounted on the second pattern 12b of the individual board 1b.

The method for mounting the specific electronic component 21 of the present embodiment is a method for mounting electronic components including the specific electronic component 21 on the sheet 100 on which the individual board 1a and the individual board 1b are allocated.

In the present mounting method, in a first step, as shown in FIG. 2B, on the primary mounting surface 100a of the sheet 100, the specific electronic components 21 are surface-mounted using soldering on a first land 111a of the individual board 1a and a second land 121b of the individual board 1b, respectively. Moreover, the electronic component 22, the electronic component 23, the connector 24 and the like are mounted on lands other than the first land 111*a* in the first pattern 11*a* of the individual board 1*a*. Furthermore, the electronic component 25 and the like are mounted on lands other than the second land 121*b* in the second pattern 12*b* of the individual board 1*b*.

Next, as shown in FIG. 2C, the sheet 100 is turned over. Thereafter, in a second step, as shown in FIG. 2D, on the secondary mounting surface 100*b* of the sheet 100, the electronic component 25 and the like are mounted on lands other than a second land 121*a* in the second pattern 12*a* of the individual board 1*a*. Moreover, as for the individual board 1*b*, the electronic component 22, the electronic component 23, the connector 24 and the like are mounted on lands other than a first land 111*b* in the first pattern 11*b*.

Since in the above-described method, the specific electronic components 21 can be mounted on both the individual boards 1*a* and 1*b* before the sheet 100 is warped, failures of mounting the electronic components on the sheet 100 can be reduced and mounting efficiency can be increased.

2. Configuration of Individual Board

Returning to FIG. 1A, for the individual board 1, the first pattern 11 is formed on the one surface and the second pattern 12 is formed on the other surface. The individual board 1 is a rigid board, and is a both-side mounting board. While the individual board 1 is a single-layer board in the present embodiment, it may be a multilayer board.

Particularly, as shown in FIG. 1C, the first land 111 is provided to the first pattern 11 of the individual board 1, and the second land 121 is provided to the second pattern 12. The first land 111 and the second land 121 have the same pin configuration. For example, the first land 111 and the second land 121 include four pins, respectively. In either of the first land 111 and the second land 121, the specific electronic component 21 is joined by soldering.

As described before, the specific electronic component 21 is an electronic component such as a chip-carrier type electronic component. The terminal spacing of the chip-carrier type electronic component is very narrow, such as 0.5 mm or less, for example. Therefore, the above-described electronic component is susceptible to the warpage of the sheet 100 at the time of mounting. For the solder, lead-free solder is preferable, but not limitative. For example, as the lead-free solder, Sn—Ag—Cu based, Sn—Zn based, or Sn—Ag—Bi—In based solder is preferable. This is because lead is subject to regulation of harmful substances. However, the lead-free solder tends to have a melting point higher than that of the solder including lead. Accordingly, when the lead-free solder is used, a heating temperature for melting the solder needs to be higher, and thus the warpage of the sheet 100 becomes large due to the higher heating temperature. When large warpage occurs and the size of the electronic component to be mounted is small, the advantage by the configuration of the present embodiment can be obtained more effectively.

As shown in FIG. 1C, the first land 111 and the second land 121 are connected through the through-hole 13. The through-hole 13 is constructed so as to conduct electricity between the first land 111 and the second land 121. The through-hole 13 is connected to the lands for the other electronic components with the traces in the individual board 1. As shown in 1D, the traces or conductors in the individual board 1 are formed so that the specific electronic component 21 joined to the first land 111 or the second land 121 can obtain similar electrical connection to the other electronic components to communicate with the other electronic components whenever the specific electronic component 21 is conducted to the first land 111 or the second land 121. That is, the specific electronic component 21 can similarly communicate with the other electronic components, whenever the specific electronic component 21 is conducted to the first land 111 and the second land 121.

For a reason of circuit pattern design or the like, the electronic component 21 is preferably arranged on a position closer to an end (peripheral edge portion) of the individual board than the other electronic components arranged on the individual board (the electronic component 22, the electronic component 25 and the like). Arranging the electronic component 21 on an position closer to an end (peripheral edge portion) of the individual board, this increases flexibility of design, and makes it easy to design a circuit pattern. Moreover, the electronic component 21 is preferably arranged on a position closer to an end (peripheral edge portion) of the sheet 100 than the other electronic components arranged on the sheet 100 (the electronic component 22, the electronic component 25 and the like). In this case, the merit of the configuration of this embodiment is acquired more efficiently. For example, as shown in FIG. 2B, the specific electronic components 21 are arranged in the vicinity of both end portions in a longitudinal direction of the sheet 100. In the vicinity of both the end portions of the sheet 100, the warpage of sheet 100 is larger than that around the center of the sheet 100 in the longitudinal direction. That is, when the specific electronic component 21 is arranged in the vicinity of both the end portions, an amount of variation in spacing between the lands on which the specific electronic component 21 is soldered becomes larger than that when the component 21 is arranged around the center in the longitudinal direction. Thus, the specific electric component 21 is susceptible to the warpage when it is arranged. However, according to present embodiment, the specific electronic component 21 is mounted in both individual boards 1*a* and 1*b*, before the individual board 1*b* is warped. Thus it is not susceptible to the warpage, and is capable for mounting the specific electronic component 21 favorably.

In the present embodiment, the specific electronic component 21 joined to the first land 111 or the second land 121 is the chip-carrier type electronic component. However the specific electronic component 21 is not limited to this, and may be of a flatpack type. That is, the specific electronic component 21 only needs to be of a surface-mounting type.

3. Mounting Method

A method for mounting the electronic components on the individual boards 1*a* and 1*b* configured as described above is described. FIG. 3A is a cross-sectional view of the individual board 1*a*, and FIG. 3B is a cross-sectional view of the individual board 1*b*. In FIGS. 3A and 3B, for both of the individual boards 1*a* and 1*b*, the first patterns 11*a* and 11*b* are formed on the upper side in the figures. In the present embodiment, the individual board 1*a* shown in FIG. 3A, in which the specific electronic component 21 is mounted on the first land 111*a* of the first pattern 11*a* and the individual board 1*b* shown in FIG. 3B, in which the specific electronic component 21 is mounted on the second land 121*b* of the second pattern 12*b* are simultaneously manufactured. Hereinafter, an example using mounting machines such as a cream soldering printing machine, a chip mounter, and flow soldering equipment is described.

Figure 4A:
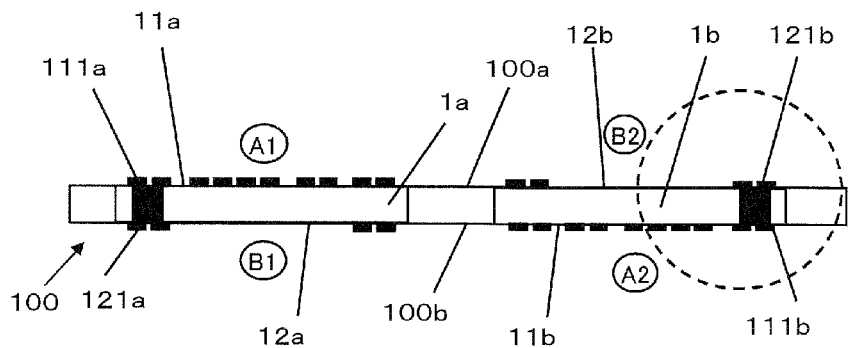
FIGS. 4A to 4D are views for explaining the method for mounting the electronic components according to the embodiment.

FIGS. 4A to 4D are Z-Z cross-sectional views of the above-described FIGS. 2A to 2D (although a Z-Z line is shown only in FIG. 2A, FIGS. 4B to 4D are also the cross-sectional views in the same cross-sectional position as in the FIG. 4A). As shown in FIG. 2A, on the primary mounting surface 100a of the sheet 100, the first pattern 11a of the individual board 1a and the second pattern 12b of the individual board 1b are formed. Moreover, on the secondary mounting surface 100b which is the back surface of the primary mounting surface 100a, the second pattern 12a of the individual board 1a and the first pattern 11b of the individual board 1b are formed.

First, as shown in FIGS. 2A and 4A, the sheet 100 is disposed with the primary mounting surface 100a facing up.

Figure 4B:
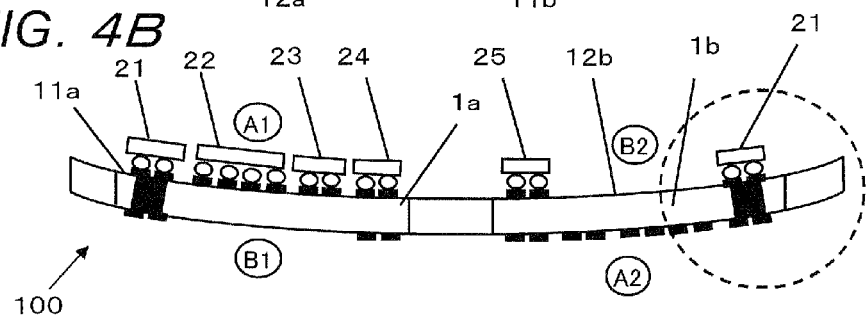

Next, as shown in FIGS. 2B and 4B, the electronic components are mounted on the primary mounting surface 100a of the sheet 100 by the mounting machines. Specifically, the mounting machine mounts the electronic component 22, the electronic component 23, the connector 24, the electronic component 25 and the like on the first pattern 11a of the individual board 1a and the second pattern 12b of the individual board 1b. Moreover, the specific electronic components 21 are mounted on both the first land 111a provided in the first pattern 11a of the individual board 1a and the second land 121b provided in the second pattern 12b of the individual board 1b. At this time, the warpage is caused in the sheet 100 by soldering processing of the electronic components 21, 22, . . . . FIG. 4B shows a state of the sheet 100 where the warpage is caused.

Figure 4C:
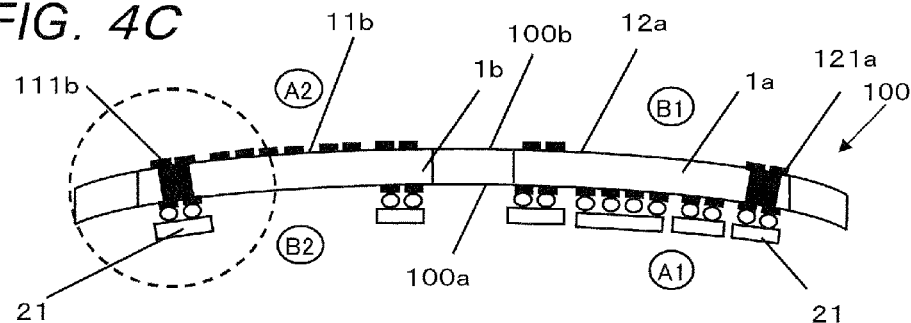

Next, as shown in FIGS. 2C and 4C, the sheet 100 is turned over by a lifter. Here, the sheet 100 is turned over by reversing the sheet 100 in an up-down direction and in a right and left direction in the figures. This brings the sheet 100 into a state where the secondary mounting surface 100b including the second pattern 12a of the individual board 1a and the first pattern 11b of the individual board 1b faces up.

Figure 4D:
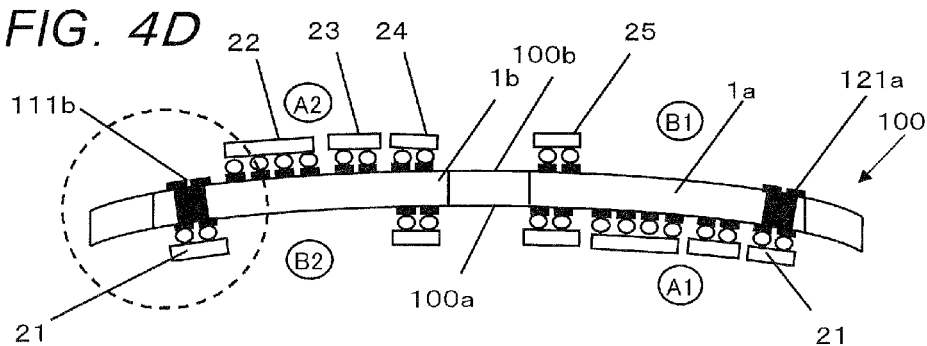
Figure 5A:
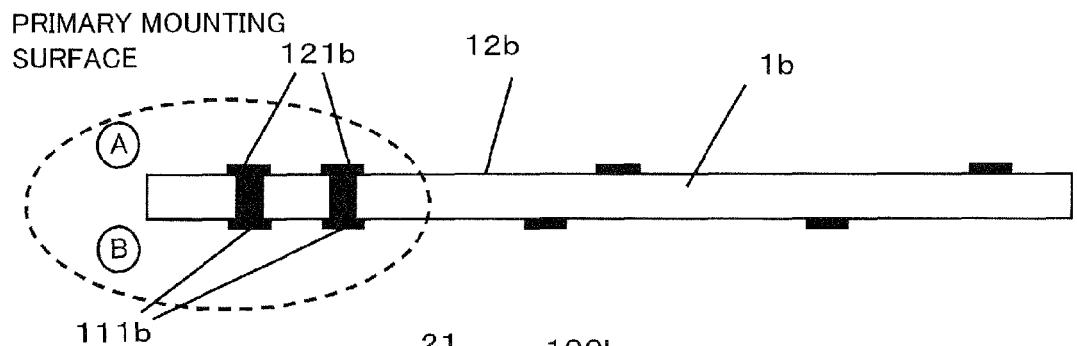
FIGS. 5A to 5D are views for explaining the method for mounting the electronic components according to the embodiment.
Figure 5B:
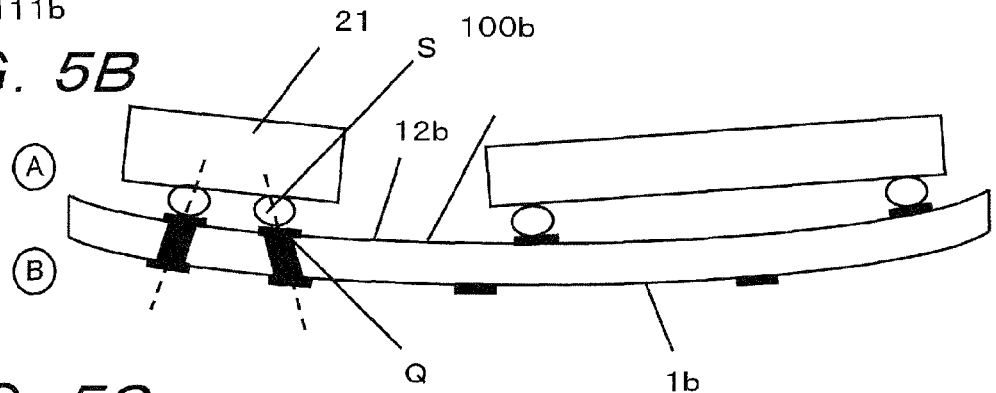
Figure 5C:
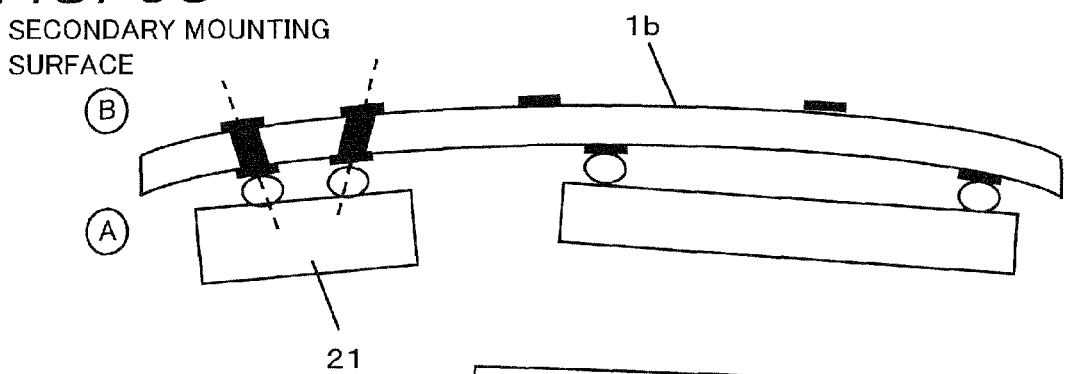
Figure 5D:
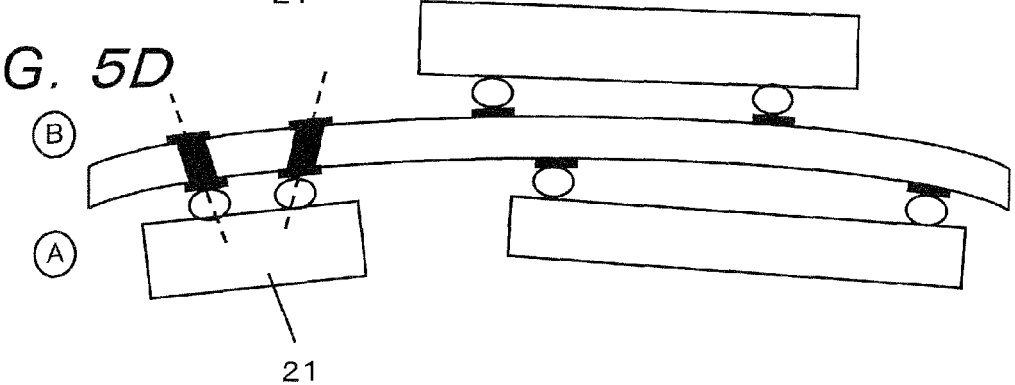

Next, as shown in FIGS. 2D and 4D, the mounting machines mounts the electronic components on the secondary mounting surface 100b of the sheet 100. Specifically, the mounting machines mounts the electronic component 22, the electronic component 23, the connector 24, the electronic component 25 and the like on the second pattern 12a of the individual board 1a and the first pattern 11b of the individual board 1b. Here, since the specific electronic components 21 are already mounted on the first land 111a and the second land 121b upon mounting on the primary mounting surface 100a of the sheet 100, the specific electronic components 21 are not mounted on the second land 121a and the first land 111b on the secondary mounting surface 100b side at this time.

Thereafter, the mounting machine cuts the sheet 100 to separate the individual board 1a and the individual board 1b, so that the individual board 1a and the individual board 1b having the above-described electronic components 21 to 25 mounted thereon are produced. Between the individual board 1a and the individual board 1b produced in this manner, although the circuit board pattern on which the specific electronic component 21 is mounted is different (the first pattern or the second pattern), the electrical connection of the specific electronic component 21 is identical. In the individual board 1a and the individual board 1b as a bare board with no electronic components mounted, arrangements of the traces, lands and the like are identical, and the same circuit board pattern is formed.

According to the above-described mounting method, the number of electronic components mounted on the primary mounting surface 100a of the sheet 100 and the number of electronic components mounted on the secondary mounting surface 100b can be almost the same, so that the mounting efficiency can be increased. Moreover, the specific electronic components 21 are mounted on both the individual boards 1a and 1b at the primary mounting in which the warpage has not been caused in the sheet 100. This can eliminate the influence by the warpage of the sheet 100 at the mounting of the specific electronic components 21. Thus, even when the pitch between terminals of the electronic component such as the specific electronic component 21 is short, trouble can be diminished, in which a mounting failure is caused at the secondary mounting by the warpage of the sheet at the primary mounting. That is, the specific electronic components 21 can be favorably mounted.

A reason why the above-described effect is brought about is described using FIG. 5. FIGS. 5A to 5D are cross-sectional views of the individual board 1b showing states in the respective steps corresponding to FIGS. 4A to 4D. In the present embodiment, the specific electronic component 21 is mounted on the first pattern 11a formed on the primary mounting surface 100a side of the individual board 1a, and also, for the individual board 1b shown in FIG. 5A, the specific electronic element 21 is mounted on the second pattern 12b formed on the primary mounting surface 100a side. That is, before the individual board 1b is warped by the soldering step, the specific electronic component 21 is mounted. This makes it unnecessary to mount the specific electronic component 21 on the second pattern after turning over the individual board 1b as shown in FIG. 5C so that it is enough to mount only the components other than the specific electronic component 21 as shown in FIG. 5D. Accordingly, in the mounting of the specific electronic element 21, soldering failure caused by the solder being not properly placed on a pin can be diminished.

4. Correspondence Relation between the Embodiment and the Claims

The sheet 100 is one example of the printed circuit board. The individual board 1 (1a and 1b) is one example of an individual board. The first pattern 11 (11a, 11b) is one example of a first circuit board pattern. The second pattern 12 (12a, 12b) is one example of a second circuit board pattern. The specific electronic component 21 is one example of a third component. The electronic component 22 is one example of a first component. The electronic component 25 is one example of a second component.

5. Conclusion

The present embodiment describes the printed circuit board 100 having the primary mounting surface 100a and the secondary mounting surface 100b, to which at least the first and second individual boards 1a and 1b are allocated. In the printed circuit board 100, for the first individual board 1a, the first pattern 11 on which the electronic component 22 (first component) and the specific electronic component 21 (third component) can be mounted is formed on the primary mounting surface 100a side, and a second pattern 12 on which the electronic component 25 (second component) and the specific electronic component 21 (third component) can be mounted is formed on the secondary mounting surface 100b side, and for the second individual board 1b, the first pattern 11 on which the electronic component 22 and the specific electronic component 21 can be mounted is formed on the secondary mounting surface 100b side, and the second pattern 12 on which the electronic component 25 and the specific electronic component 21 can be mounted is formed on the primary mounting surface 100a side, so that the electronic component 22 and the specific electronic component 21 are mounted on the first pattern 11 of the first individual board 1a and the electronic component 25 is mounted on the second pattern 12 of the first individual board 1a, while the electronic component 22 is mounted on the first pattern 11 of the second individual board 1b, and the electronic component 25 and the specific electronic component 21 are mounted on the second pattern 12 of the second individual board 1b. Further, in the first and second individual boards 1a and 1b, the traces for the specific electronic component 21 are provided so that electrical connections between the specific electronic component 21 and the other components 22, 25, . . . are identical between the case where the specific electronic component 21 is mounted on the first pattern 11, and the case where the specific electronic component 21 is mounted on the second pattern 12.

Moreover, the present embodiment is the method for mounting the specific electronic component 21, wherein the electronic component 22 and the specific electronic component 21 are mounted on the first pattern 11 of the first individual board 1a, and the electronic component 25 and the specific electronic component 21 are mounted on the second pattern 12 of the second individual board 1b. The electronic component 22 is mounted on the first pattern 11 of the first individual board 1a, and at the same time, the electronic component 25 is mounted on the second pattern 12.

This can increase the mounting efficiency while reducing mounting failures of the specific electronic component 21 on the individual board 1a or 1b.

Other Embodiments

As an embodiment, Embodiment 1 is exemplified. However, the technical idea of the present embodiment is not limited to Embodiment 1, but can be realized in other embodiments.

In the present embodiment, the example in which besides the specific electronic component 21, the electronic component 22, the electronic component 23, the connector 24, the electronic component 25 and the like are mounted on the individual board is described. However, the technical idea of the present embodiment is not limited to this, but any electronic component can be mounted. For example, an insertion-mounting type electronic component, an SD card holder, or a USB connector can be considered.

While in the present embodiment, as an example of the mounting method, the method of producing the two individual boards from one sheet is described. However, the number of the individual boards is not limited to this, and the idea of the present embodiment can also be applied to a case where at least two or more individual boards are made of one sheet.

Moreover, while in the present embodiment, the through-hole 13 is explained as an example of the connection portion. However, the technical idea of the present embodiment is not limited to this, but any conductive connection portion may be employed. For example, a via or the like may be employed.

Namely, the technical idea of the present embodiment is not limited to the above-described embodiment, but various embodiments can be carried out.

INDUSTRIAL APPLICABILITY

The technical idea of the present embodiment can be applied to a printed circuit board on which a plurality of individual boards for use in electronic equipment such as a digital camera, a portable terminal and a recorder are allocated.

What is claimed is:
1. A printed circuit board comprising:
a primary mounting surface and a secondary mounting surface, to which at least first and second individual boards are provided, the primary mounting surface being provided on a front side of the printed circuit board and the secondary mounting surface being provided on a back side of the printed circuit board,
a first circuit board pattern, on which a first component and a third component are mountable, provided on the primary mounting surface side of the first individual board, and a second circuit board pattern, on which a second component and the third component are mountable, provided on the secondary mounting surface side of the first individual board,
the first circuit board pattern, on which the first component and the third component are mountable, provided on the secondary mounting surface side of the second individual board, and the second circuit board pattern, on which the second component and the third component are mountable, provided on the primary mounting surface side of the second individual board, wherein:
in a case where the first component and the third component are mounted on the first circuit board pattern of the first individual board and the second component is mounted on the second circuit board pattern of the first individual board without mounting the third component on the second circuit board pattern of the first individual board, or
in a case where the first component is mounted on the first circuit board pattern of the second individual board without mounting the third component on the first circuit board pattern of the second individual board, and the second component and the third component are mounted on the second circuit board pattern of the second individual board,
in the first and second individual boards, traces for the third component are provided so that electrical connections between the third component and the other components are identical between the case where the third component is mounted on the first circuit board pattern, and the case where the third component is mounted on the second circuit board pattern.

2. The printed circuit board according to claim 1, wherein the third component is a WCSP (Wafer Level Chip Size Package).

3. The printed circuit board according to claim 1, wherein a pitch between terminals of the third component is 0.5 mm or less.

4. The printed circuit board according to claim 1, wherein the third component is arranged at a position closer to an end portion of the printed circuit board than the first component and the second component on the first individual board or the second individual board.

5. The printed circuit board according to claim 1, wherein the third component is arranged at a position closer to an end portion of the printed circuit board than the first component and the second component on the printed circuit board.

6. The first individual board and the second individual board are produced by cutting the printed circuit board according to claim 1.

7. A printed circuit board comprising:
a primary mounting surface provided on a front side of the printed circuit board, the primary mounting surface including a first circuit board pattern provided on a first individual board and a second circuit board pattern provided on a second individual board;

wherein a first component and a third component are mountable on the first circuit board pattern;

wherein a second component and the third component are mountable on the second circuit board pattern; and a secondary mounting surface provided on a back side of the printed circuit board, the secondary mounting surface including the second circuit board pattern provided on the first individual board and the first circuit board pattern provided on the second individual board;

wherein, in the primary mounting surface, the first and third components are mounted on the first individual board and the second and third components are mounted on the second individual board; and wherein, in the secondary mounting surface, the second component without the third component is mounted on the first individual board and the first component without the third component is mounted on the second individual board, a electrical trace of first, second, and third components on the first individual board and a electrical trace of first, second, and third components on the second individual board are same.

8. The printed circuit board according to claim 7, wherein the third component is a WCSP (Wafer Level Chip Size Package).

9. The printed circuit board according to claim 7, wherein a pitch between terminals of the third component is 0.5 mm or less.

10. The printed circuit board according to claim 7, wherein the third component is arranged at a position closer to an end portion of the printed circuit board than the first component and the second component on the first individual board or the second individual board.

11. The printed circuit board according to claim 7, wherein the third component is arranged at a position closer to an end portion of the printed circuit board than the first component and the second component on the printed circuit board.

12. The first individual board and the second individual board are produced by cutting the printed circuit board according to claim 7.

* * * * *